(12) United States Patent
Ebihara

(10) Patent No.: US 10,827,143 B2
(45) Date of Patent: Nov. 3, 2020

(54) CMOS IMAGE SENSOR CLAMPING METHOD WITH DIVIDED BIT LINES

(71) Applicant: OmniVision Technologies, Inc., Santa Clara, CA (US)

(72) Inventor: Hiroaki Ebihara, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 53 days.

(21) Appl. No.: 16/222,827

(22) Filed: Dec. 17, 2018

(65) Prior Publication Data

US 2019/0268555 A1    Aug. 29, 2019

Related U.S. Application Data

(60) Provisional application No. 62/634,754, filed on Feb. 23, 2018.

(51) Int. Cl.
*H04N 5/378* (2011.01)
*H04N 5/3745* (2011.01)
*H01L 27/146* (2006.01)

(52) U.S. Cl.
CPC ....... *H04N 5/378* (2013.01); *H01L 27/14634* (2013.01); *H01L 27/14636* (2013.01); *H01L 27/14643* (2013.01); *H04N 5/37455* (2013.01)

(58) Field of Classification Search
CPC .... H04N 5/378; H04N 5/37455; H04N 5/379; H01L 27/14634; H01L 27/14636; H01L 27/14643
See application file for complete search history.

(56) References Cited

U.S. PATENT DOCUMENTS 9,609,213 B2    3/2017   Wakabayashi
2012/0119065 A1*  5/2012   Cieslinski ............ H04N 5/3658
                                                    250/208.1

OTHER PUBLICATIONS

ROC (Taiwan) Patent Application No. 108105744—Office Action and English Translation dated May 6, 2020, 12 pages.

\* cited by examiner

*Primary Examiner* — Nicholas G Giles
(74) *Attorney, Agent, or Firm* — Christensen O'Connor Johnson Kindness PLLC

(57) ABSTRACT

An image sensor includes a pixel array including a plurality of pixels. A bit line is coupled to a column of pixels of the pixel array. The bit line is separated in to a plurality of portions coupled to the column of pixels. The portions of the bit line are electrically isolated from one another. A readout circuit is coupled to a first portion of the bit line coupled to a first portion of rows of pixels from the column of pixels to read image data from the first portion of rows of pixels from the column of pixels. The readout circuit is further coupled to a second portion of the bit line coupled to a second portion of rows of pixels from the column of pixels to read image data from the second portion of rows of pixels from the column of pixels.

23 Claims, 9 Drawing Sheets

CMOS IMAGE SENSOR CLAMPING METHOD WITH DIVIDED BIT LINES

CROSS REFERENCE TO RELATED APPLICATION

The application claims the benefit of U.S. Provisional Application No. 62/634,754, filed Feb. 23, 2018, the contents of which are incorporated herein by reference.

BACKGROUND INFORMATION

Field of the Disclosure

This disclosure relates generally to bit lines, and in particular but not exclusively, relates to bit lines for use with image sensors.

Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

The pixels included in image sensors include photodiodes that generate image charge in response to light that is incident upon the image sensor. The image charge is transferred from the photodiodes through transfer transistors to floating diffusions in order to capture image data. The image data in the floating diffusions is amplified and read out through bit lines in order to read out the image data from the image sensor. The frame rate for reading out images from in an image sensor is limited by the bit line settling time.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
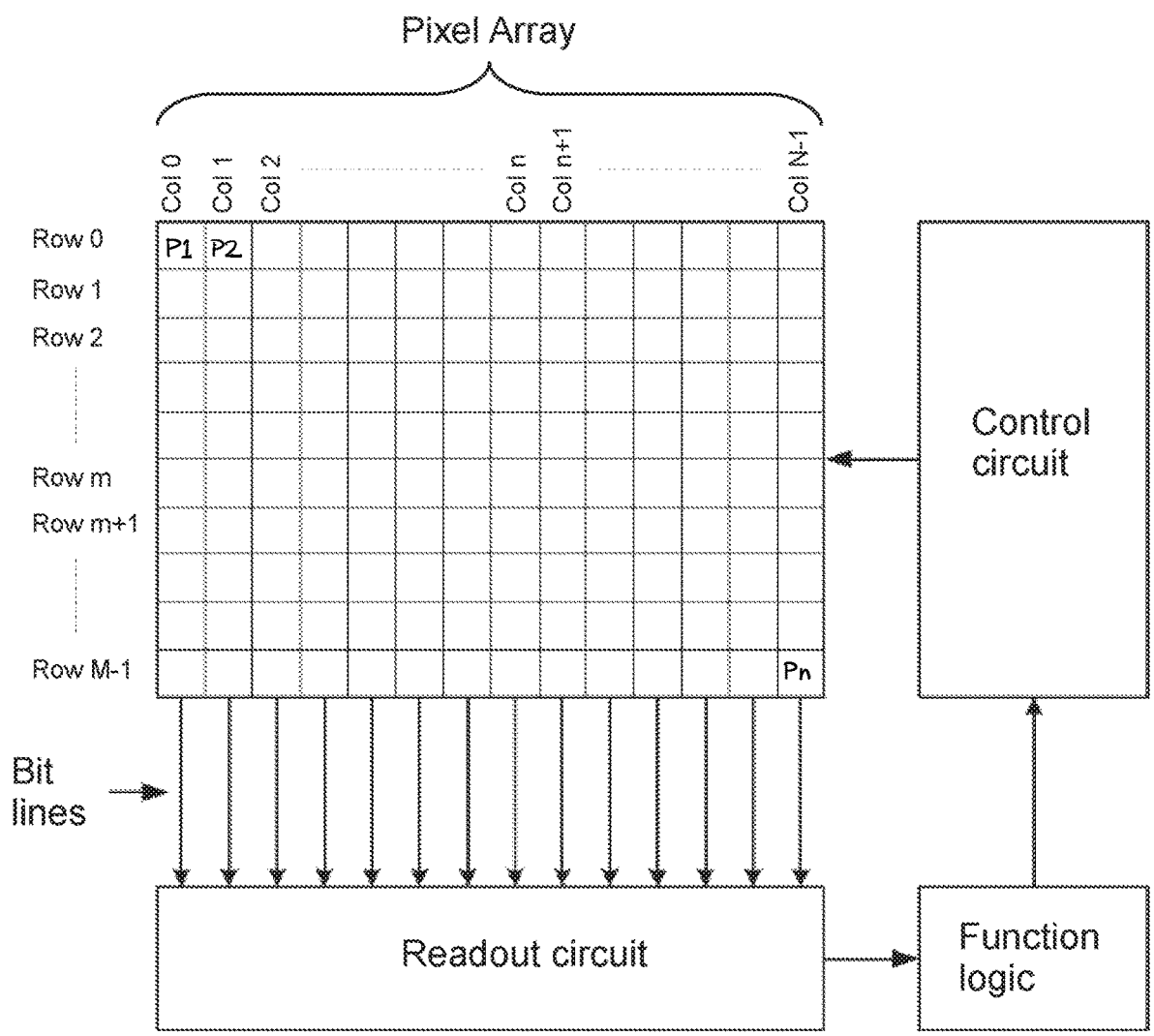
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Methods and apparatuses for dividing bit lines in an imaging circuit are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

The frame rate of image sensor is limited by the bit line settling time. Bit line settling time can be shortened by reducing bit line capacitance. As will be discussed, in various examples, the bit lines are divided into separate portions that are electrically isolated from one another in examples in accordance with the teachings of the present disclosure. By dividing bit lines into separate portions, the capacitance on each divided bit line is reduced. As will be shown, in one example, column bit lines are divided or segmented into separate portions near the middle to form a "top" bit line portion and a "bottom" bit line portion for each column, which are coupled to single readout circuit through hybrid bonds between wafers. In this way, the lengths of the separate bit line segments are shorter, and the capacitance on each separate bit line portion can therefore be reduced so that bit line settling time can be reduced. As a result, the frame rate of the CMOS image sensor (CIS) is improved in accordance with the teachings of the present invention.

To illustrate, FIG. 1 shows one example of an imaging system in accordance with an embodiment of the present disclosure. As shown, the imaging system includes a pixel array, a control circuit, a readout circuit, and function logic. In one example, the pixel array is a two-dimensional (2D) array of photodiodes, or image sensor pixels (e.g., pixels P1, P2, . . . , Pn). As illustrated, the image sensor pixels are arranged into rows (e.g., rows Row 0 to Row M−1) and columns (e.g., column Col 0 to Col N−1) to acquire image data of a person, place, object, etc., which can then be used to render a 2D image of the person, place, object, etc. However, the pixels do not have to be arranged into rows and columns and may take other configurations.

In one example, after each image sensor photodiode/pixel in pixel array has acquired its image charge through photo-generation of the image charge, corresponding image data is readout by the readout circuit and then transferred to function logic. The readout circuit may be coupled to readout image data from the plurality of photodiodes in the pixel array. In various examples, the readout circuit may include amplification circuits, analog-to-digital (ADC) conversion circuits, or otherwise. In one example, the readout circuit may readout a row of image data at a time along readout column bit lines as illustrated in FIG. 1. The function logic may store the image data or even manipulate the image data by applying post image effects (e.g., crop, rotate, remove red eye, adjust brightness, adjust contrast, or otherwise).

Figure 2A:
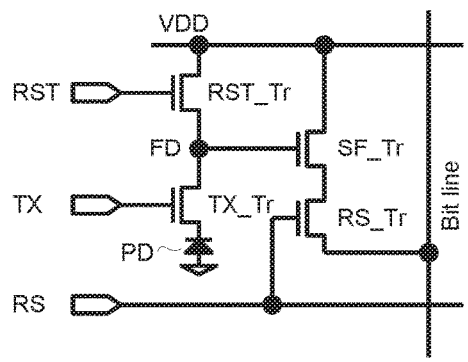
FIGS. 2A and 2B are example schematics of pixels in accordance with an embodiment of the present disclosure.
Figure 2B:
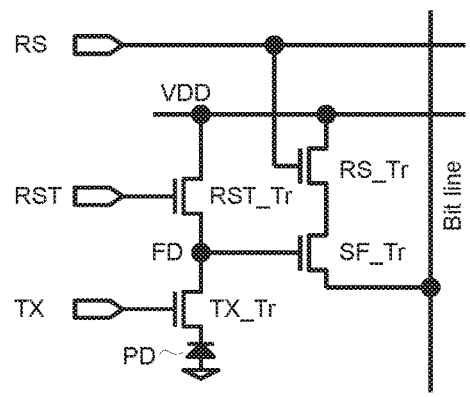

FIGS. 2A and 2B are example schematics of a pixel in accordance with an embodiment of the present disclosure. The pixels illustrated in FIGS. 2A and 2B may be examples of pixels forming the pixel array in FIG. 1. The illustrated embodiments of a pixel may comprise a photodiode (PD), a floating diffusion (FD), a reset transistor (RST_Tr), a transfer transistor (TX_Tr), a source follower transistor (SF_Tr), and a row select transistor (RS_Tr).

The reset transistor RST_Tr may be controlled by a RST control signal provided to a gate electrode of RST_Tr. Other control signals such as RS and TX may be similarly provided to gate electrodes of RS_Tr, and TX_Tr, respectively. The various control signals may be provided by control circuit to control the operation of any pixel in order to reset the pixel and to read out signal voltage, e.g., image data. In some embodiments, image charges photo-generated by the PD may be transferred to FD by turning on TX transistor, which may induce a signal voltage on FD. The voltage on the FD may be read out though the bit line. The SF transistor SF_Tr and row select transistor RS_Tr are connected in series between power line VDD and the bit line. Either SF_Tr or RS_Tr can be connected to VDD and the bit line, which are shown alternatively in FIG. 2A and FIG. 2B.

Pixel configurations in accordance with the teachings of the present invention are not limited to the example pixels shown in FIGS. 2A and 2B. For example, it is appreciated that examples in accordance with the teachings of the present invention may also apply to 3T pixel configurations, which may not include RS_Tr. In addition, it is further appreciated that in other examples multiple photodiodes PD may share the same FD, RST_Tr, SF_Tr and RS_Tr.

Figure 3:
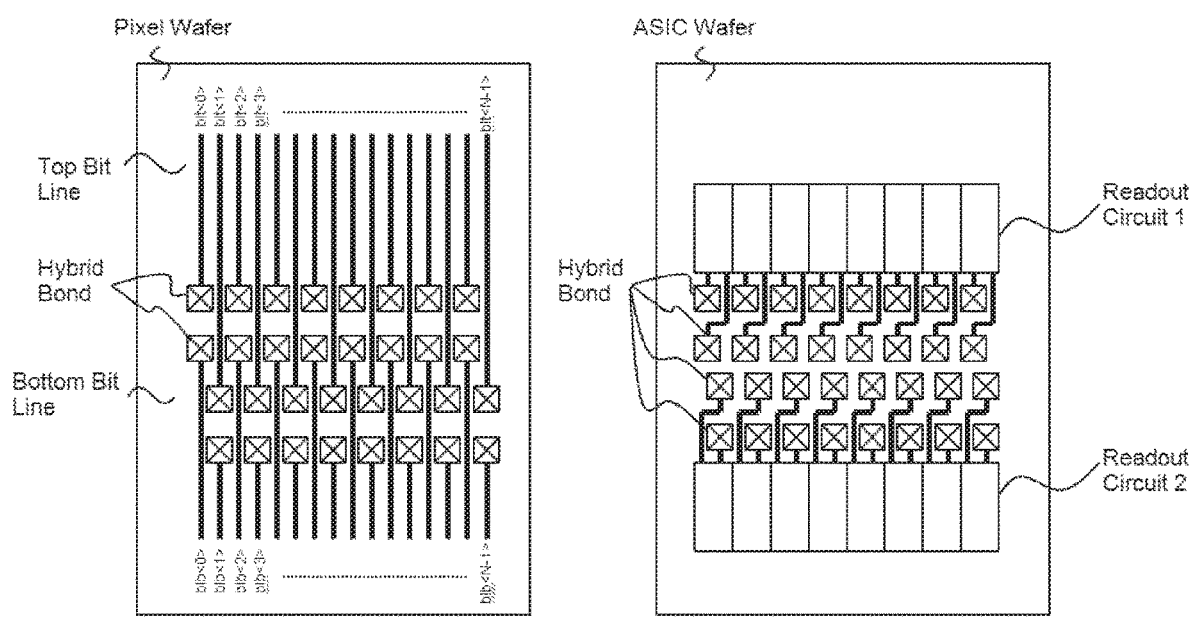
FIG. 3 shows an example of stacked sensors implemented with a pixel wafer and an ASIC wafer in accordance with an embodiment of the present disclosure.

FIG. 3 shows an example of stacked sensors implemented with a pixel wafer and an application specific integrated circuit (ASIC) wafer in accordance with an embodiment of the present disclosure. In the depicted example, the pixel wafer includes a pixel array (not shown) and the ASIC wafer includes a readout circuit. The pixel wafer also includes bit lines to read out signals from pixel array in pixel wafer to the ASIC wafer. In one example, the bit line of each column is divided or segmented near the middle to form a top bit line portion and a bottom bit line portion. The top bit line portion and the bottom bit line portion is connected to a same single readout circuit through hybrid bonds between the pixel wafer and the ASIC wafer. The lengths of the separated bit line portions are electrically isolated from one another and therefore shortened compared to the entire bit line for the column of the pixel array. As a result, the capacitance on each bit line portion may be reduced so that bit line settling time may be reduced, which enables the frame rate of the CIS (CMOS Image Sensor) to be increased in accordance with the teachings of the present invention.

In some situations, it is noted that the pitch of the hybrid bond may be larger than that of the bit lines. If this is the case, the bit lines may be cut or segmented at different places. The example shown in FIG. 3 illustrates an example in which the pitch of the hybrid bond is larger than that of the bit lines. As shown in the depicted example, first readout circuit1 is coupled to hybrid bonds that are coupled to bit lines that are divided at a first location of the pixel array (e.g., between rows m+2 and m+3 of the pixel array), while second readout circuit2 is coupled to hybrid bonds that are coupled to bit lines that are divided at a second location of the pixel array (e.g., between rows m+4 and m+5 of the pixel array) (See also FIG. 4). As a consequence, the number of different locations of the pixel array to divide bit lines may be optimized depending on pitch ratio between bit lines and hybrid bonds. For example, if the pitch of hybrid bond is larger than twice that of the bit lines, but equal to or smaller than three times that of the bit lines, each bit line may be cut at three or more places in accordance with the teachings of the present invention.

In the example of FIG. 3, the pitch of the readout circuits is also larger than that of the bit lines. Again, the layout and/or allocation of the readout circuits may be adjusted depending on the relationship between the pitches of the bit lines and the readout circuits. For example, the readout circuit may be placed in a single row located on the top or the bottom side of the ASIC wafer if its pitch is equal to or smaller than that of the bit lines in accordance with the teachings of the present invention.

Figure 4:
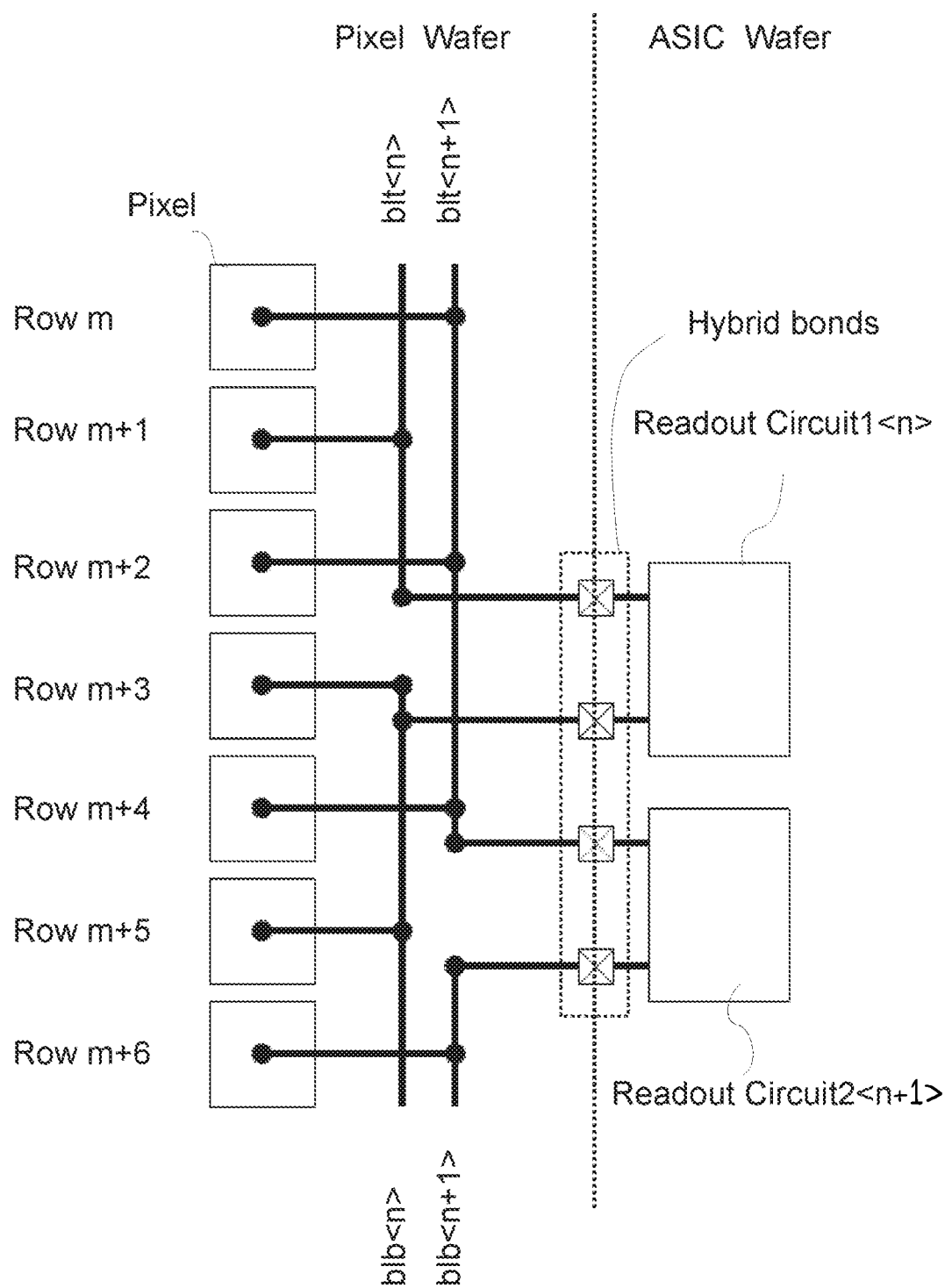
FIG. 4 shows an example of connections between pixels, bit lines, hybrid bonds and readout circuits in accordance with an embodiment of the present disclosure.

FIG. 4 shows one example of connections between pixels, bit lines, hybrid bonds and readout circuits in accordance with an embodiment of the present disclosure. As shown in the depicted example, there are two bit line segments per readout column, and each bit line is separated at different locations in the pixel array. For instance, as shown in the example illustrated in FIG. 4, the top bit line blt<n> and bottom bit line blb<n> are divided between rows m+2 and m+3 of the pixel array and are coupled to be read out via first readout circuit1<n> through hybrid bonds, while the top bit line blt<n+1> and blb<n+1> are divided at a different location between rows m+4 and m+5 of the pixel array and are coupled to be read out via a different second readout circuit2<n> through hybrid bonds. As shown in the depicted example, the pixels and bit lines are disposed in a pixel wafer, while the readout circuits are disposed in a separate ASIC wafer coupled to the pixel wafer through the hybrid bonds in a stacked chip scheme.

In the depicted example, the top bit line blt<n> is coupled to the top portion of rows of the pixel array that are less than or equal to row m+2, and the bottom bit line blb<n> is coupled to the bottom portion of rows of the pixel array that are greater than or equal to row m+3. As shown, a first readout circuit1<n> is coupled to read out the signals from the top bit line blt<n> and the bottom bit line blb<n> through hybrid bonds. Similarly, the top bit line blt<n+1> is coupled to the top portion of rows of the pixel array that are less than or equal to row m+4, and the bottom bit line blb<n+1> is coupled to the bottom portion of rows of the pixel array that are greater than or equal to row m+5. As shown, a second readout circuit1<n+1> is coupled to read out the signals from the top bit line blt<n+1> and the bottom bit line blb<n+1> through hybrid bonds. It is noted that in this configuration, disabled (or unselected) bit line segments may be capacitively coupled to enabled (or selected) bit lines and/or floating diffusion of selected pixel through capacitances.

Figure 5:
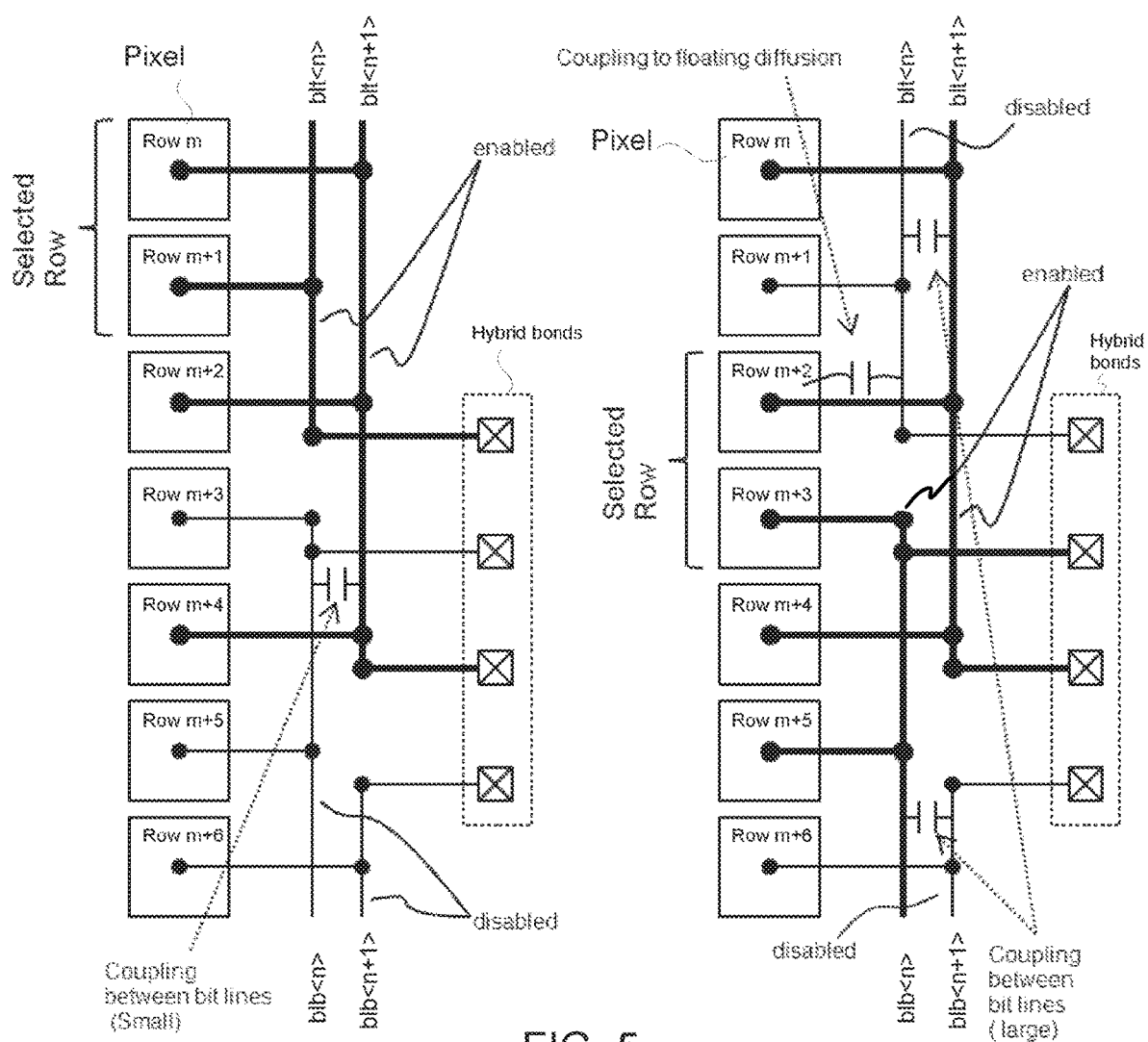
FIG. 5 shows an example of a disabled bit line that is coupled to an enabled bit line and/or a floating diffusion of selected pixel in accordance with an embodiment of the present disclosure.

FIG. 5 shows an example of how a disabled bit line is capacitively coupled to an enabled bit line and/or a floating diffusion of selected pixel. As shown in FIG. 5, when Row m and Row m+1 are selected, bit lines blt<n> and blt<n+1> are selected. In this situation, the signal of the pixel in Row m is readout via bit line blt<n+1>, and the signal of pixel in Row m+1 is readout via bit line blt<n>. The bit lines blb<n> and blb<n+1> are disabled or not used to readout signals from any pixels. In this example, the capacitive coupling between enabled bit lines and disabled bit lines is small and therefore negligible.

However, when Row m+2 and Row m+3 are selected, bit lines blt<n+1> and blb<n> are selected. In this situation, the signal of the pixel in Row m+2 is readout via bit line blt<n+1>, the signal of pixel in Row m+3 is readout via blb<n>, and bit lines blt<n> and blb<n+1> are disabled. In this example, capacitive coupling between enabled bit lines and disabled bit lines can be large because blt<n> and blt<n+1> are routed closely with a long length in parallel and the same with bit lines blb<n> and blb<n+1>.

In addition to bit line to bit line coupling capacitance, disabled bit lines may have coupling capacitance to floating diffusions of pixels selected for reading. For example, in FIG. 5, bit line blt<n> is routed near a coupling to pixels in Row m+2 when Row m+2 and Row m+3 are selected. The capacitive coupling between bit line blt<n> and a floating diffusion of a pixel in Row m+2 may affect the signal readout if disabled the bit line blt<n> is unstable. Therefore, disabled bit lines need to be stable enough not to affect any signal readouts.

Figure 6:
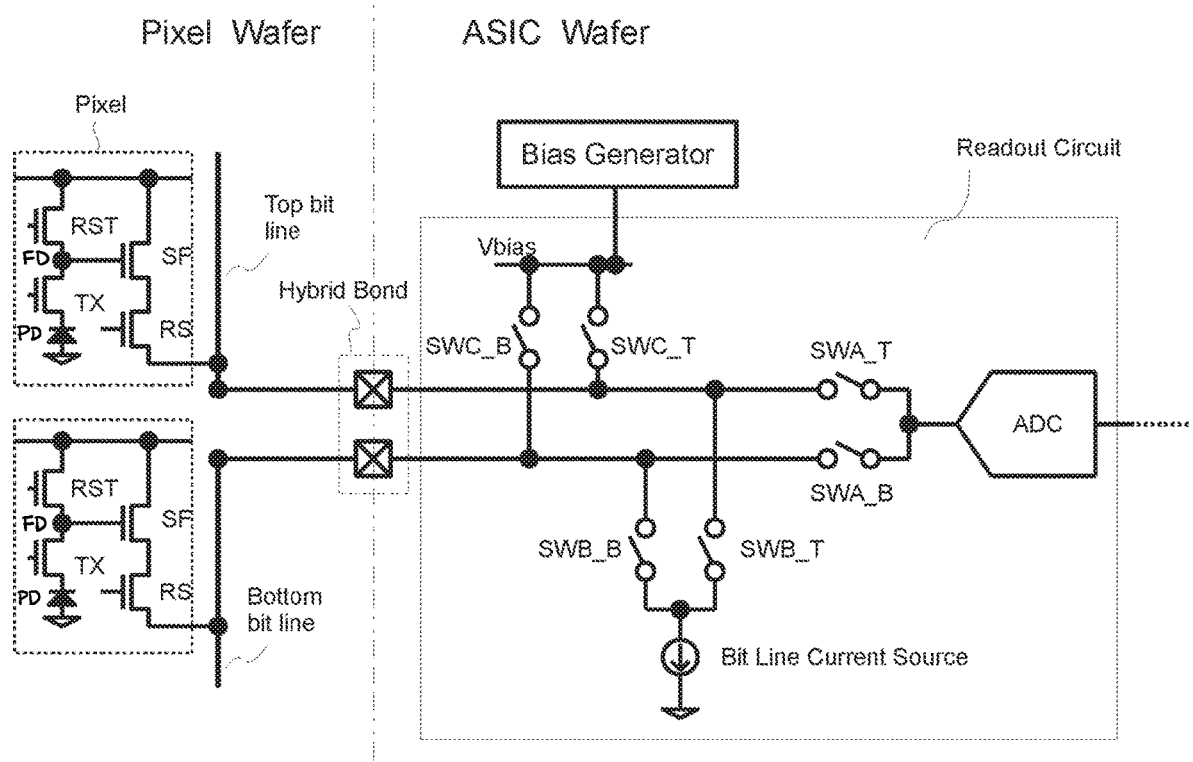
FIG. 6 is a diagram an example of readout circuits included in an imaging system in accordance with an embodiment of the present disclosure.

FIG. 6 is a diagram an example of readout circuits included in an imaging system in accordance with an embodiment of the present disclosure. In the depicted example, pixels are included in a pixel wafer and readout circuits are included in an ASIC wafer. In one example, each readout circuit may include a bit line current source to supply constant current to each bit line, an ADC (Analog-to-Digital Converter) to convert bit line signals to digital code, and switching circuitry that includes a first set of switches to connect the top bit line to the ADC input through switch SWA_T and to connect bottom bit line to the ADC input through SWA_B, a second set of switches to connect top bit line to the bit line current source through SWB_T and to connect bottom bit line to the bit line current source through SWB_B, a third set of switches to supply a bias voltage to the top bit line through SWC_T and to supply the bias voltage to the bottom bit line through SWC_B.

Figure 10A:
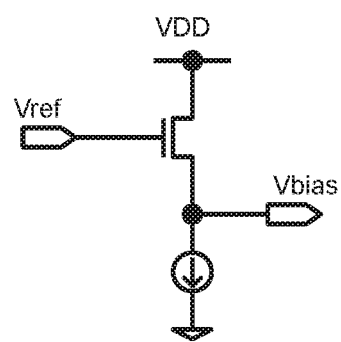
FIG. 10A shows an example of a driver circuit for a bias generator that uses a source follower buffer in case intermediate voltage is needed to supply Vbias in accordance with an embodiment of the present disclosure.
Figure 10B:
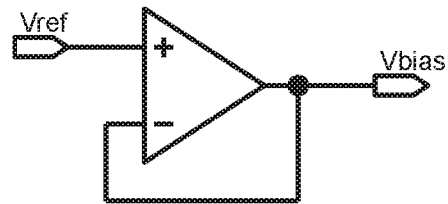
FIG. 10B shows another example of a driver circuit for a bias generator that uses a voltage follower driven by an operational amplifier in case intermediate voltage is needed to supply Vbias in accordance with an embodiment of the present disclosure.

A CMOS image sensor (CIS) in accordance with an embodiment of the present disclosure may include an optional bias generator to generate the bit line bias voltage Vbias. In one example, the bias voltage Vbias may be any intermediate voltage between VDD and GND. In another example, it is appreciated that VDD may also be used directly as the bias voltage Vbias without the need or presence of the optional bias generator. FIGS. 10A and 10B show some examples of driver circuits for the optional bias generator for examples in which an intermediate voltage is needed to supply the bias voltage Vbias. As illustrated, the bias generator example depicted in FIG. 10A employs a source follower buffer coupled to the VDD voltage rail to supply the bias voltage Vbias. In another example, the bias generator depicted in FIG. 10B employs a voltage follower driven by an operational amplifier to supply the bias voltage Vbias. It is appreciated that the requirement for drivability on the driver circuit in the bias generator is not stringent in accordance with various embodiments of the present disclosure. For instance, if the loading capacitance is 8 nF, the current consumption of a driver circuit can be about several tens to several hundred micro-amperes.

In one example, it is noted that disabled bit lines should not be biased to GND during operation because a large Vds voltage may come across the RS and/or SF devices, as can be observed for instance in FIG. 6. In most cases, a SF device and a RS device are connected in series between VDD and a bit line. If bit line is biased to ground, voltage difference across SF and RS devices may be as large as VDD. As a consequence, the Vds voltage across the RS and/or SF devices will be large as well. A large Vds voltage across the RS and/or SF devices may cause hot carriers and light emission, which may accumulate in the photodiode and can cause an unwanted white pixel or increase an unwanted dark signal.

When signals are read out through the top bit line, as illustrated for example in FIG. 6, the switches SWA_T and SWB_T are turned on to couple the top bit line to the ADC and bit line current source, while the switches SWC_T, SWA_B and SWB_B are turned off to decouple the bottom bit line from the ADC and bit line current source. SWC_B is switched on to couple the bottom bit line to the bias voltage to make the disabled bottom bit line stable. On the other hand, when signals are read out through the bottom bit line, the switches SWA_B and SWB_B are turned on, and the switches SWC_B, SWA_T and SWB_T are turned off. In addition, the SWC_T is switched on to couple the top bit line to the bias voltage to make the disabled top bit line stable.

Figure 7:
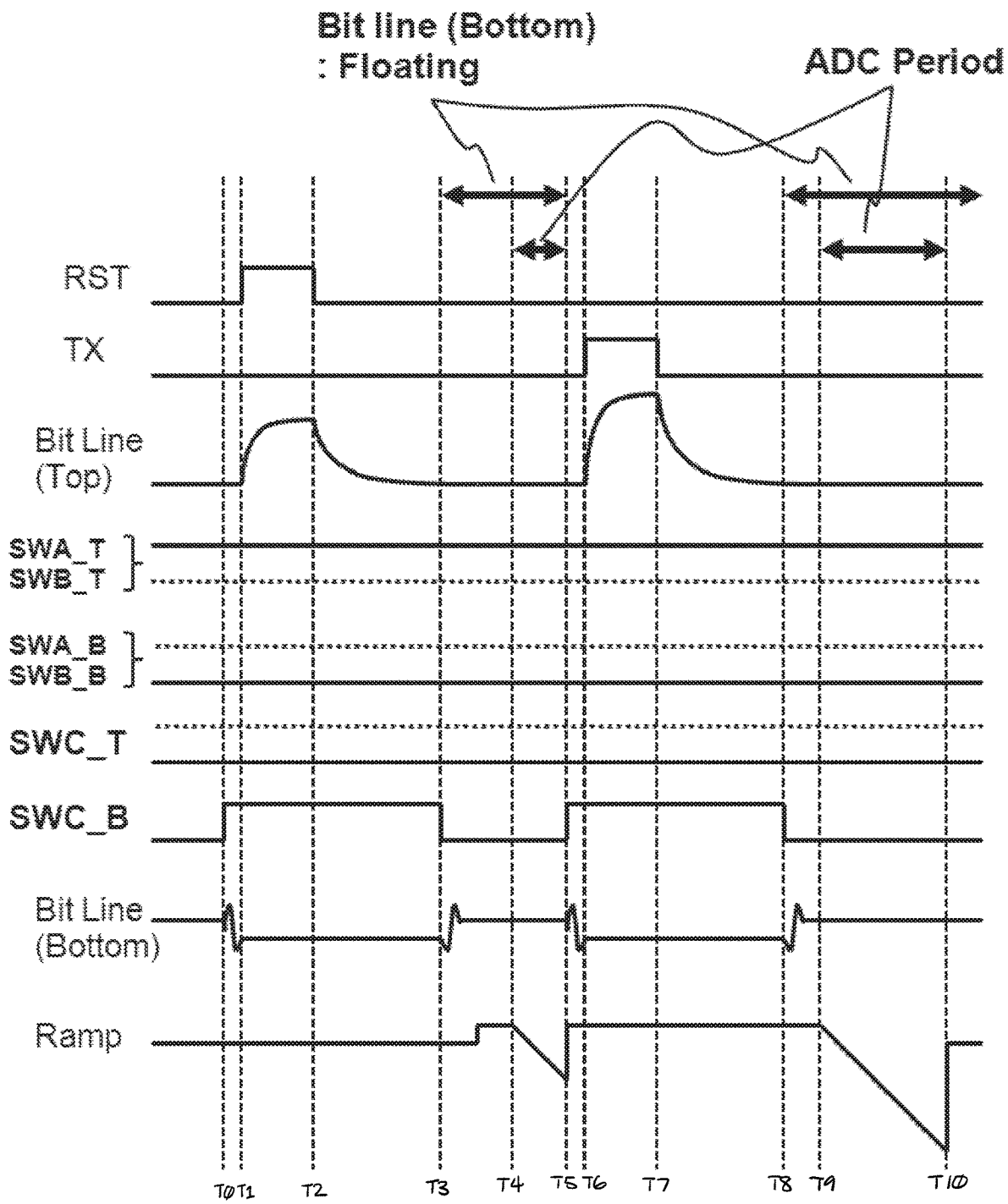
FIG. 7 is a timing diagram illustrating example waveforms of pixels and readout circuits in accordance with an embodiment of the present disclosure.

To illustrate, FIG. 7 is a timing diagram illustrating example waveforms of pixels and readout circuits in accordance with an embodiment of the present disclosure. FIG. 7 shows how switch SWC_B is controlled when signal is read out through the top bit line. During the ADC period when the ADC circuit converts the signal on the top bit line to its digital code, SWC_B is turned off to float the bottom bit line. As a result, voltage of the bottom bit line may be stable because most of the coupling capacitance on the bottom bit line is between the bottom bit line and the power lines (ideally to ground) or between the bottom bit line and the enabled bit lines. This means that the capacitive coupling between the enabled top bit line and the disabled bottom bit line is equivalent to the capacitive coupling between the enabled top bit line and power lines (e.g., ground) or between the enabled top bit line and other enabled bit lines. The capacitive coupling between the enabled top bit line and other enabled bit lines is smaller than the capacitive coupling between the enabled top bit line and ground, resulting in the condition that bit lines are shielded by ground, and therefore the enabled top bit lines are stable in accordance with an embodiment of the present disclosure.

As shown in FIG. 7, the voltage of the enabled top bit line responds with two large bumps or pulses (at times T1-T2 and T6-T7), one of which is caused at time T1 by the reset operation (e.g., RST=high at times T1-T2) of the pixel, and the other of which is caused at time T6 by the transfer operation (e.g., TX=high at times T6-T7) of image charge from the photodiode PD to the floating diffusion FD (see also FIG. 6) of the pixel. During those two periods (times T1-T2 and T6-T7), the bias voltage Vbias is supplied to the disabled bottom bit lines by turning on the switch SWC_B at times T0-T3 and T5-T8 (see also FIG. 6). After the voltage variation of the enabled top bit line becomes stable at times T3 and T8 (i.e., with the value being small enough) after certain time, switch SWC_B is turned off at times T3 and T8 to float the disabled bit line. This process makes it less possible for the bias voltage of the disabled bottom bit line to cause any significant voltage influence or variation to the enabled top bit line or adjacent bit lines when pixel undergoes a reset (at times T1-T2) or a signal is readout (at times T6-T7).

The requirement for bias voltage generator may be relaxed a bit because a relatively small amount of errors are tolerable on enabled bit line, disabled bit line and Vbias when the SWC_B switch is turned off. As such, VDD may be directly used as the bias voltage Vbias because Vbias is disconnected from the disabled bit lines during the analog-to-digital conversion (ADC) periods (times T4-T5 and T9-T10). The capacitive coupling between the disabled bit lines and the enabled bit line no longer causes degeneration of the power supply rejection ratio (PSRR) because the disabled bit lines are floating and noise from VDD doesn't propagate to the disabled bit lines.

It is appreciated that the time controlled floating of the disabled bit lines as illustrated in the example of FIG. 7 is a much better solution than simply biasing all of the disabled bit lines to certain voltage. If disabled bit lines are not floating, their impedances would have to be small to avoid large variations that may influence the reading of signals during the ADC periods. This would mean that the bias generator (see, e.g., FIG. 6) would have to have a strong driving capability, which in turn may require large power supply. This is because the bias voltage Vbias would be supplied to all disabled bit lines of the entire pixel array. Indeed, the load capacitance that the bias generator would drive would be large. For instance, if the number of bit lines is 8000 and each bit line has a capacitance of 2 pF, the loading of the drive will be 8 nF (i.e., 2 pF*8000/2, assuming half of the bit lines are disabled). If the target bandwidth of Vbias is set at 5 MHz, power consumption of the bias generator may run at several tens of milliamps (mA), which may not be acceptable for small CMOS image sensors (CIS), which are often used in mobile devices, etc. Another way to bias a disabled bit line may be by pulling it up directly to VDD, but the PSRR of the sensor would be degraded due to noise on the VDD voltage rail, which could propagate to the disabled bit lines. Although the Vds of the RS and/or SF devices may be small, the PSRR may get worse since the capacitive coupling between the enabled bit line and the disabled bit line is equivalent to the capacitive coupling between the enabled bit line and VDD.

Figure 8:
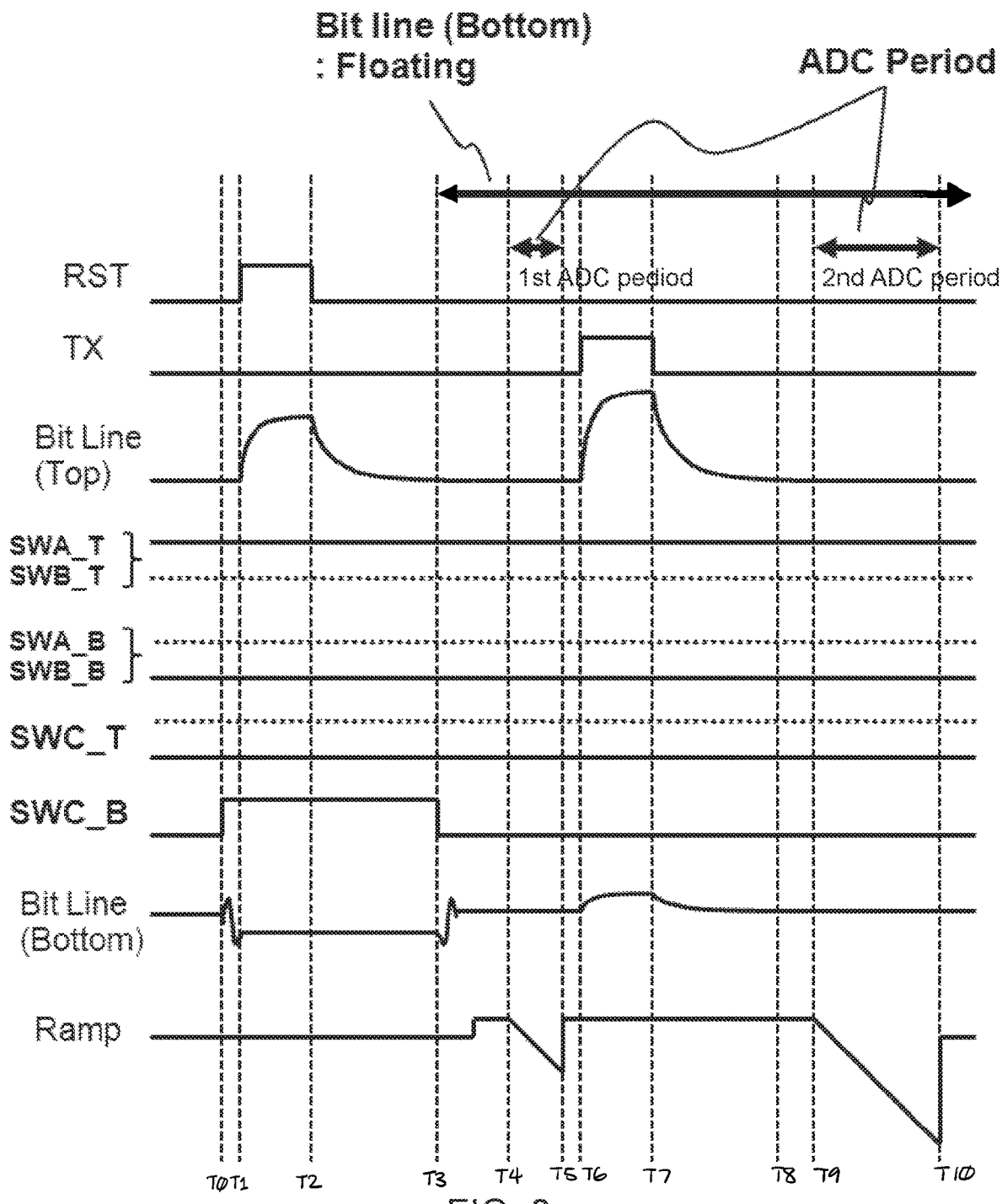
FIG. 8 is another timing diagram illustrating example waveforms of pixels and readout circuits in accordance with an embodiment of the present disclosure.

FIG. 8 is another timing diagram illustrating example waveforms of pixels and readout circuits in accordance with an embodiment of the present disclosure. In particular, similar to the example depicted in FIG. 7, FIG. 8 shows another example of a control method for the switch SWC_B when signals are read out through top bit lines. In the example depicted in FIG. 8, the SWC_B is turned on at times T0-T3, which is only around the pixel reset operation (e.g., RST=high at times T1-T2), and is turned off the rest of the time, including during the transfer operation (e.g., TX=high at times T6-T7). The disabled bit line on the bottom is biased to Vbias after pixel reset. The total charge on the bottom bit line is kept unchanged between the first and second ADC periods because bottom bit line is kept floating after pixel reset. This method is good if the disabled bit line couples only to one enabled bit line because in this case, crosstalk between enabled bit lines are not increased by making disabled bit lines floating and the total equivalent capacitance on the enabled bit line becomes smaller at time T7-T8 when bit line voltage is changed.

Figure 9:
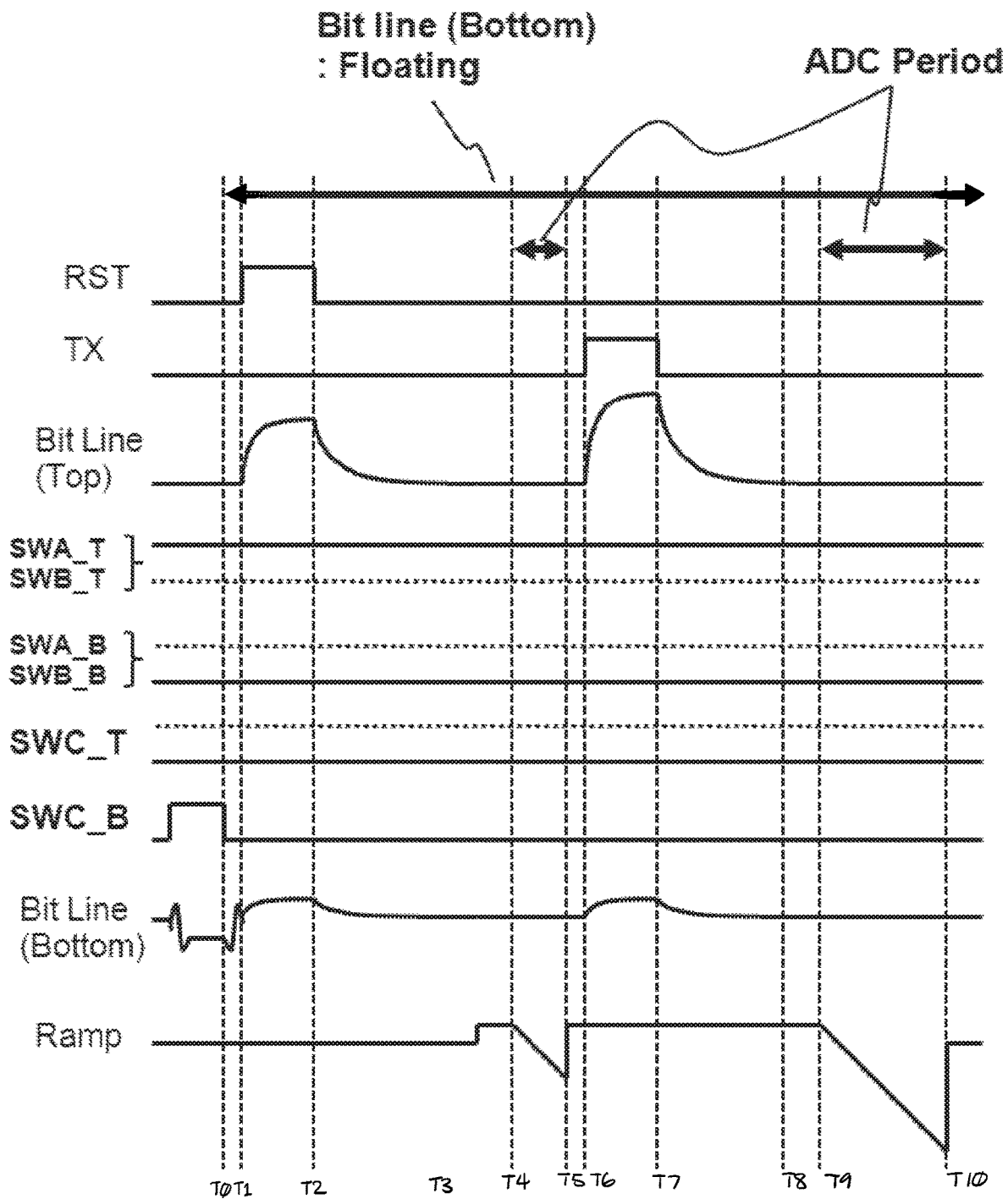
FIG. 9 is yet another timing diagram illustrating example waveforms of pixels and readout circuits in accordance with an embodiment of the present disclosure.

FIG. 9 is yet another timing diagram illustrating example waveforms of pixels and readout circuits in accordance with an embodiment of the present disclosure. In particular, FIG. 9 shows another example of a biasing sequence. In the depicted example, the SWC_B is turned on only at the beginning of the readout sequence (i.e., just prior to the pixel reset operation (e.g., RST=high at times T1-T2)) such that the bottom bit line is only biased to Vbias at the beginning of the readout sequence. After that, the bottom bit line is kept floating during the entire readout period. It is appreciated that a benefit provided by the sequence depicted in FIG. 9 is almost the same as that of the one sequence shown in FIG. 8.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a pixel array including a plurality of pixels, wherein each pixel is coupled to generate image data in response to incident light;
   a bit line coupled to a column of pixels of the pixel array, wherein the bit line is separated in to a plurality of portions coupled to the column of pixels, wherein the portions of the bit line are electrically isolated from one another; and
   a readout circuit coupled to a first portion of the bit line coupled to a first portion of rows of pixels from the column of pixels to read image data from the first portion of rows of pixels from the column of pixels, wherein the readout circuit is further coupled to a second portion of the bit line coupled to a second portion of rows of pixels from the column of pixels to read image data from the second portion of rows of pixels from the column of pixels, wherein the readout circuit comprises:
   an analog-to-digital converter (ADC) coupled to convert analog image data received from the bit line to digital image data; and switching circuitry coupled between the bit line and the ADC,
  wherein the switching circuitry is configured to couple the ADC to the first portion of the bit line during an ADC period of converting the analog image data received from the first portion of the bit line to the digital image data during a readout operation from a pixel coupled to the first portion of the bit line,
  wherein the switching circuitry is configured to decouple the ADC from the second portion of the bit line during the readout operation from the pixel coupled to the first portion of the bit line, and
  wherein the switching circuitry is configured to float the second portion of the bit line during the ADC period of converting the analog image data received from the first portion of the bit line to the digital image data.

2. The image sensor of claim 1, wherein the pixel array and the bit line are disposed in a first wafer and wherein the readout circuit is disposed in a second wafer.

3. The image sensor of claim 1, wherein the bit line is a first bit line of a plurality of bit lines, wherein the column of pixels is a first column of pixels of a plurality of columns of the pixel array, and wherein the readout circuit is first readout circuit of a plurality of readout circuits, wherein the image sensor further comprises:
  a second bit line of the plurality of bit lines, wherein the second bit line is coupled to a second column of pixels of pixels of the plurality of columns of the pixel array, wherein the second bit line is separated in to a plurality of portions coupled to the second column of pixels, wherein the portions of the second bit line are electrically isolated from one another; and
  a second readout circuit of the plurality of readout circuits, wherein the second readout circuit is coupled to a first portion of the second bit line coupled to a first portion of rows of pixels from the second column of pixels to read image data from the first portion of rows of pixels from the second column, wherein the second readout circuit is further coupled to a second portion of the second bit line coupled to a second portion of rows of pixels from the second column of pixels to read image data from the second portion of rows of pixels from the second column of pixels.

4. The image sensor of claim 3, wherein the first portion of rows of pixels from the first column of pixels is different than the first portion of rows of pixels from the second column of pixels, and wherein the second portion of rows of pixels from the first column of pixels is different than the second portion of rows of pixels from the second column of pixels.

5. The image sensor of claim 1,
  wherein the switching circuitry is configured to couple a bit line current source to the first portion of the bit line during the readout operation from the pixel coupled to the first portion of the bit line, and
  wherein the switching circuitry is configured to decouple the bit line current source from the second portion of the bit line during the readout operation from the pixel coupled to the first portion of the bit line.

6. The image sensor of claim 1, wherein the switching circuitry is configured to couple the second portion of the bit line to a bias voltage during a reset operation of the pixel coupled to the first portion of the bit line.

7. The image sensor of claim 6, wherein the switching circuitry is further configured to couple the second portion of the bit line to the bias voltage during a transfer operation of the pixel coupled to the first portion of the bit line.

8. The image sensor of claim 1, wherein the switching circuitry is configured to couple the second portion of the bit line to a bias voltage at a beginning of the readout operation from the pixel coupled to the first portion of the bit line prior to a reset operation of the pixel coupled to the first portion of the bit line.

9. The image sensor of claim 1, wherein the first readout circuit further comprises a bias generator coupled to supply a bias voltage coupled to be received by the switching circuitry.

10. The image sensor of claim 9, wherein the bias generator comprises a source follower buffer coupled to a voltage rail to supply the bias voltage.

11. The image sensor of claim 9, wherein the bias generator comprises a voltage follower driven by an operational amplifier to supply the bias voltage.

12. An imaging system, comprising:
  a pixel array including a plurality of pixels to generate image data in response to incident light and organized into a plurality of rows and a plurality of columns;
  control circuitry coupled to the pixel array to control operation of the pixel array;
  a plurality of bit lines coupled to the pixel array, wherein each bit line is coupled to a corresponding column of pixels of the pixel array, wherein each bit line is separated in to a plurality of portions, wherein the portions of each bit line are electrically isolated from one another, wherein the plurality of bit lines includes a first bit line coupled to a first column of pixels of the pixel array; and
  a first readout circuit coupled to a first portion of the first bit line, wherein the first portion of the first bit line is coupled to a first portion of rows of pixels from the first column of pixels, wherein the first readout circuit is further coupled to a second portion of the first bit line, wherein the second portion of the first bit line is coupled to a second portion of rows of pixels from the first column of pixels, wherein the first readout circuit comprises:
    an analog-to-digital converter (ADC) coupled to convert analog image data received from the first bit line to digital image data; and
    switching circuitry coupled between the first bit line and the ADC,
      wherein the switching circuitry is configured to couple the ADC to the first portion of the first bit line during an ADC period of converting the analog image data received from the first portion of the first bit line to the digital image data during a readout operation from a pixel coupled to the first portion of the first bit line,
      wherein the switching circuitry is configured to decouple the ADC from the second portion of the first bit line during the readout operation from the pixel coupled to the first portion of the bit line, and
      wherein the switching circuitry is configured to float the second portion of the first bit line during the ADC period of converting the analog image data received from the first portion of the first bit line to the digital image data.

13. The imaging system of claim 12, further comprising function logic coupled to the first readout circuit to store image data read out from the pixel array.

14. The imaging system of claim 12, wherein the pixel array and the plurality of bit lines are disposed in a first wafer and wherein the first readout circuit is disposed in a second wafer.

15. The imaging system of claim 12, wherein the plurality of bit lines further includes a second bit line coupled to a second column of pixels of the pixel array, wherein the imaging system further comprises:
a second readout circuit coupled to a first portion of the second bit line, wherein the first portion of the second bit line is coupled to a first portion of rows of pixels from the second column of pixels, wherein the second readout circuit is further coupled to a second portion of the second bit line, wherein the second portion of the second bit line is coupled to a second portion of rows of pixels from the second column of pixels.

16. The imaging system of claim 15, wherein the first portion of rows of pixels from the first column of pixels is different than the first portion of rows of pixels from the second column of pixels, and wherein the second portion of rows of pixels from the first column of pixels is different than the second portion of rows of pixels from the second column of pixels.

17. The imaging system of claim 12,
wherein the switching circuitry is configured to couple a bit line current source to the first portion of the first bit line during the readout operation from the pixel coupled to the first portion of the first bit line, and
wherein the switching circuitry is configured to decouple the bit line current source from the second portion of the first bit line during the readout operation from the pixel coupled to the first portion of the first bit line.

18. The imaging system of claim 12, wherein the switching circuitry is configured to couple the second portion of the first bit line to a bias voltage during a reset operation of the pixel coupled to the first portion of the first bit line.

19. The imaging system of claim 18, wherein the switching circuitry is further configured to couple the second portion of the bit line to the bias voltage during a transfer operation of the pixel coupled to the first portion of the first bit line.

20. The imaging system of claim 12, wherein the switching circuitry is configured to couple the second portion of the bit line to a bias voltage at a beginning of the readout operation from the pixel coupled to the first portion of the first bit line prior to a reset operation of the pixel coupled to the first portion of the first bit line.

21. The imaging system of claim 12, wherein the first readout circuit further comprises a bias generator coupled to supply a bias voltage coupled to be received by the switching circuitry.

22. The imaging system of claim 21, wherein the bias generator comprises a source follower buffer coupled to a voltage rail to supply the bias voltage.

23. The imaging system of claim 21, wherein the bias generator comprises a voltage follower driven by an operational amplifier to supply the bias voltage.

* * * * *